(12) United States Patent
Bellaouar et al.

(10) Patent No.: US 10,326,420 B1
(45) Date of Patent: Jun. 18, 2019

(54) RECEIVER CIRCUITS FOR MILLIMETER WAVE DEVICES

(71) Applicant: GLOBALFOUNDRIES INC., Grand Cayman (KY)

(72) Inventors: Abdellatif Bellaouar, Richardson, TX (US); Mehmet Ipek, Richardson, TX (US); Frank Zhang, Richardson, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/966,998

(22) Filed: Apr. 30, 2018

Related U.S. Application Data

(60) Provisional application No. 62/646,291, filed on Mar. 21, 2018.

(51) Int. Cl.
  *H03F 3/45* (2006.01)
  *H03F 3/193* (2006.01)
  *H03F 3/21* (2006.01)
  *H04B 1/16* (2006.01)

(52) U.S. Cl.
  CPC ........ *H03F 3/45269* (2013.01); *H03F 3/193* (2013.01); *H03F 3/21* (2013.01); *H04B 1/16* (2013.01); *H03F 2200/294* (2013.01); *H03F 2200/451* (2013.01); *H03F 2203/45116* (2013.01); *H03F 2203/45526* (2013.01)

(58) Field of Classification Search
  CPC .................................................. H03F 3/45269
  See application file for complete search history.

(56) References Cited

U.S. PATENT DOCUMENTS

| | | | | |
|---|---|---|---|---|
| 5,963,085 A | * | 10/1999 | Sauer | H03F 3/3081 330/300 |
| 5,973,363 A | * | 10/1999 | Staab | H01L 21/76264 257/288 |
| 6,462,723 B1 | * | 10/2002 | Yamazaki | H01L 27/124 345/82 |
| 9,341,710 B2 | | 5/2016 | Chang et al. | |
| 2005/0046497 A1 | * | 3/2005 | Nakanishi | H03K 3/0315 331/57 |
| 2007/0132500 A1 | * | 6/2007 | Embabi | H03D 7/1441 327/359 |
| 2011/0124307 A1 | * | 5/2011 | Balankutty | H04B 1/12 455/296 |
| 2012/0235857 A1 | | 9/2012 | Kim et al. | |

(Continued)

OTHER PUBLICATIONS

Viet Hoang Le, et al.; A CMOS 77-GHz Receiver Front-End for Automotive Radar; IEEE Transactions on Microwave Theory and Techniques, vol. 61, No. 10, Oct. 2013; pp. 3783-3793.

(Continued)

*Primary Examiner* — Patricia T Nguyen
(74) *Attorney, Agent, or Firm* — Williams Morgan, P.C.

(57) ABSTRACT

We disclose a receiver circuit which may be used in mm-wave devices. The receiver circuit comprises a transimpedance amplifier comprising PMOS and NMOS transistors, wherein the back gate voltages provided to the transistors may be adjusted. By adjusting the back gate voltages during device operation, structural variations and temperature variations in the threshold voltages of the transistors may be minimized and the gain compression tolerance of the receiver circuit may be increased.

17 Claims, 8 Drawing Sheets

(56) References Cited

U.S. PATENT DOCUMENTS

2013/0321198 A1  12/2013  Park et al.
2015/0381114 A1* 12/2015  Stoeger ................ H03F 1/0261
                                              375/219
2016/0301365 A1* 10/2016  Jacquemod ........ H03K 19/0013

OTHER PUBLICATIONS

Haikun Jia, et al.; A 77 GHz Frequency Doubling Two-Path Phased-Array FMCW Transceiver for Automotive Radar; IEEE Journal of Solid-State Circuits, vol. 51,. No. 10, Oct. 2016; pp. 2299-2311.
Jri Lee, et al.; A Fully-Integrated 77-GHz FMCW Radar Transceiver in 65-nm CMOS Technology; IEEE Journal of Solid-State Circuits, vol. 45, No. 12, Dec. 2010; pp. 2746-2756.

* cited by examiner

RECEIVER CIRCUITS FOR MILLIMETER WAVE DEVICES

FIELD OF THE INVENTION

Generally, the present disclosure relates to sophisticated semiconductor devices, and, more specifically, to receiver circuits for millimeter wave devices.

DESCRIPTION OF THE RELATED ART

There have been many advances in devices that use millimeter wave (mm-wave) signals. Semiconductor devices that involve mm-wave applications include devices that operate based on the electromagnetic spectrum of radio band frequencies in the range of about 30 Gigahertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave application include radar devices, high-speed communication devices (e.g., wireless gigabit (WiGig) devices), etc. Radar devices have been implemented in various applications such as vehicle safety and automation applications.

Implementing mm-wave applications produces many challenges when designing circuits for these applications, special consideration is to be given to designing receiver circuits. Receiver circuits, especially for vehicular radar devices also comprising transmitter circuits, should be designed such that the transmitter signal does not saturate the receiver circuit. Receiver circuits for all mm-wave devices, including vehicular radar devices, 5G telecommunication devices, and the like, should also be designed such that they are not saturated by external interference. Generally, saturation by transmitter signals and external interference may be reduced by increasing the compression point of the receiver circuit.

Attempts to improve receiver circuits have included multiple amplifier stages and voltage-mode mixers. However, the linearity of receiver circuits comprising voltage-mode mixers is limited and provides relatively limited compression for a given gain. For example, a compression of only −21 dB for 16 dB of gain has been reported.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to a receiver circuit, comprising a transimpedance amplifier (TIA) comprising a first PMOS transistor and a first NMOS transistor, wherein the gates of the first PMOS transistor and the first NMOS transistor are controlled by a first component of a differential input, the source of the first PMOS transistor is electrically connected to a power supply, the source of the first NMOS transistor is electrically connected to ground, and the drains of the first PMOS transistor and the first NMOS transistor provide a first component of a differential output; and a second PMOS transistor and a second NMOS transistor, wherein the gates of the second PMOS transistor and the second NMOS transistor are controlled by a second component of a differential input, the source of the second PMOS transistor is electrically connected to a power supply, the source of the second NMOS transistor is electrically connected to ground, and the drains of the second PMOS transistor and the second NMOS transistor provide a second component of a differential output; and a back gate voltage control unit configured to provide at least one PMOS back gate voltage to the back gate of at least one of the first PMOS transistor and the second PMOS transistor, and to provide at least one NMOS back gate voltage to the back gate of at least one of the first NMOS transistor and the second NMOS transistor.

In one embodiment, the present disclosure is directed to a method, comprising determining a target threshold voltage of a PMOS transistor and a target threshold voltage of a NMOS transistor, wherein the gates of the PMOS transistor and the NMOS transistor are controlled by a component of a differential input, the source of the PMOS transistor is electrically connected to a power supply, the source of the NMOS transistor is electrically connected to ground, and the drains of the PMOS transistor and the NMOS transistor provide a component of a differential output; determining a threshold voltage of the PMOS transistor and a threshold voltage of the NMOS transistor; adjusting a back gate voltage of the PMOS transistor, in response to determining that the threshold voltage of the PMOS transistor is not equal to the target threshold voltage of the PMOS transistor, in order to bring the threshold voltage of the PMOS transistor equal to the target threshold voltage of the PMOS transistor; and adjusting a back gate voltage of the NMOS transistor, in response to determining that the threshold voltage of the NMOS transistor is not equal to the target threshold voltage of the NMOS transistor, in order to bring the threshold voltage of the NMOS transistor equal to the target threshold voltage of the NMOS transistor.

In one embodiment, the present disclosure is directed to a manufacturing system, configured to manufacture an apparatus, such as is described above.

Embodiments herein may provide receiver circuits with high compression points.

BRIEF DESCRIPTION OF THE DRAWINGS

The disclosure may be understood by reference to the following description taken in conjunction with the accompanying drawings, in which like reference numerals identify like elements, and in which.

Figure 1:
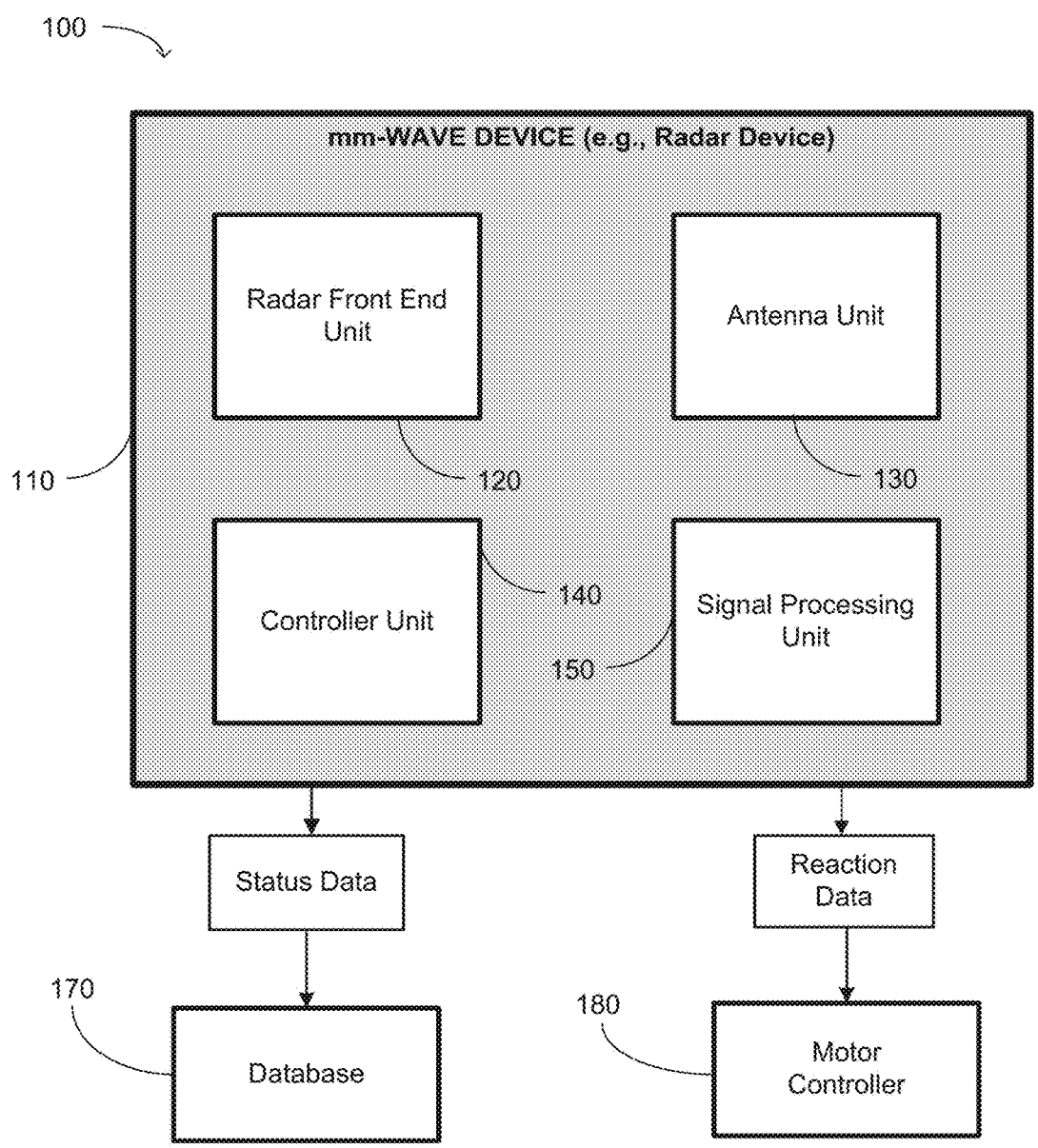
FIG. 1 illustrates a stylized block diagram representation of a radar system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for receiver circuits with high compression. Embodiments herein call for utilizing back gate biasing of one or more transistors to improve performance of mm-wave receiver circuits.

For ease of illustration, embodiments herein is depicted within the context of a radar device, however, those skilled in the art would readily appreciate that the concepts disclosed herein may be implemented in other types of devices, such as high-speed communication devices, network devices, high-definition video devices, etc. Turning now to FIG. 1, a stylized block diagram representation of an mm-wave system, in accordance with embodiments herein, is illustrated.

A system 100 may comprise an mm-wave device 110, a database 170, and a motor controller 180. The mm-wave device 110 may be a radar device, a wireless communication device, a data network device, a video device, or the like. For illustrative purposes and for the sake of clarity and ease of description, the mm-wave device 110 is described in the context of a radar application; as such, the mm-wave device 110 may also be referred to below as a radar device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The radar device 110 is capable of transmitting a radar signal, receiving a reflected signal resultant from the reflection of the radar signal, processing the reflected signal, and providing status data and/or reaction data for performing one or more actions based on the reflected signal. In one embodiment, the status data may include status of the target from which the reflection was received. Further, a motor controller 180 may control operations of one or more motors. Examples of motors may include devices that performing braking functions, steering functions, gear-shifting functions, accelerating functions, warning functions, and/or other actions relating to the operations of a road vehicle, an aircraft, and/or a watercraft. The motor controller 180 may use the reaction data and/or the status data to perform these control functions. The motor controller 180 may comprise one or more controllers that are capable of controlling a plurality of devices that perform the various operations of a road vehicle, an aircraft, and/or a watercraft.

The radar device 110 may comprise a radar front end unit 120, an antenna unit 130, a controller unit 140, and a signal processing unit 150. The radar front end unit 120 may comprise a plurality of components, circuit, and/or modules, and is capable of sending, receiving, processing, and reacting to radar signals. In one embodiment, the radar device 110 may be encompassed into a single integrated circuit (IC) chip. In some embodiments, the radar device 110 may be formed on a plurality of integrated circuits that are positioned on a single IC chip. In other embodiments, radar device 110 may be formed on single integrated circuit, which is shrouded into an IC chip.

The radar front end unit 120 is capable of providing a radar signal. In one embodiment, the frequency range of the radar signals processed by the radar device 110 may be in the range of about 10 GHz to about 90 GHz. The radar front end unit 120 is capable of generating a radar signal at a predetermined frequency range and directing the radar signal at a predetermined target area. The radar front end unit 120 is also capable of receiving a reflected signal based on the reflection of radar signal, and processing the reflected signal to determine a plurality of characteristics, such as the direction of a target, the speed of a target, the relative distance of a target, and/or the like. A more detailed description of the radar front end unit 120 is provided in FIG. 3 and accompanying description below.

In an alternative embodiment, the 120 may be a network communications front end unit, instead of a radar front end unit. In this embodiment, instead of receiving, transmitting, and/or processing radar signals, the device 110 may process network communications for various types of communication applications, such as packet data network communications, wireless (e.g., cellular communications, IEEE 802.11ad WiGig Technology, etc.), data communications, etc. The concepts disclosed herein in the context of radar applications may also be utilized for other types of applications, such as network communications, wireless communications, high-definition video, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the radar signal, while the receiver antennas are used for receiving reflected signals resulting from reflections of the radar signal. A more detailed description of the antenna unit 130 is provided in FIG. 7, and accompanying description below.

Continuing referring to FIG. 1, the radar device 110 may also comprise a signal processing unit 150. The signal processing unit is capable of performing various analog and/or digital processing of the signals that are transmitted and/or received by the radar device 110. For example, the radar signal sent transmitted by the radar device may be amplified prior to its transmission. Further, the reflected signal received by the radar device 110 may be sent through one or more analog filter stages. The reflected signals may then be converted to a digital signal by one or more analog-to-digital converters (ADC) in the signal processing unit 150. Digital signal processing (DSP) may be performed on the digitized signal. A more detailed description of the signal processing unit 150 is provided in FIG. 6 and accompanying description below.

Continuing referring to FIG. 1, the radar device 100 may also comprise a controller unit 140. The controller unit 140 may perform various control operations of the radar device 110. These functions include generating a radar signal, transmitting the radar signal, receiving a reflected signal, processing the reflected signal, and perform one or more determinations of the location, direction, speed, etc. of a target based on the reflected signal. The controller unit 140 is capable of generating the status data and the reaction data described above.

Figure 2:
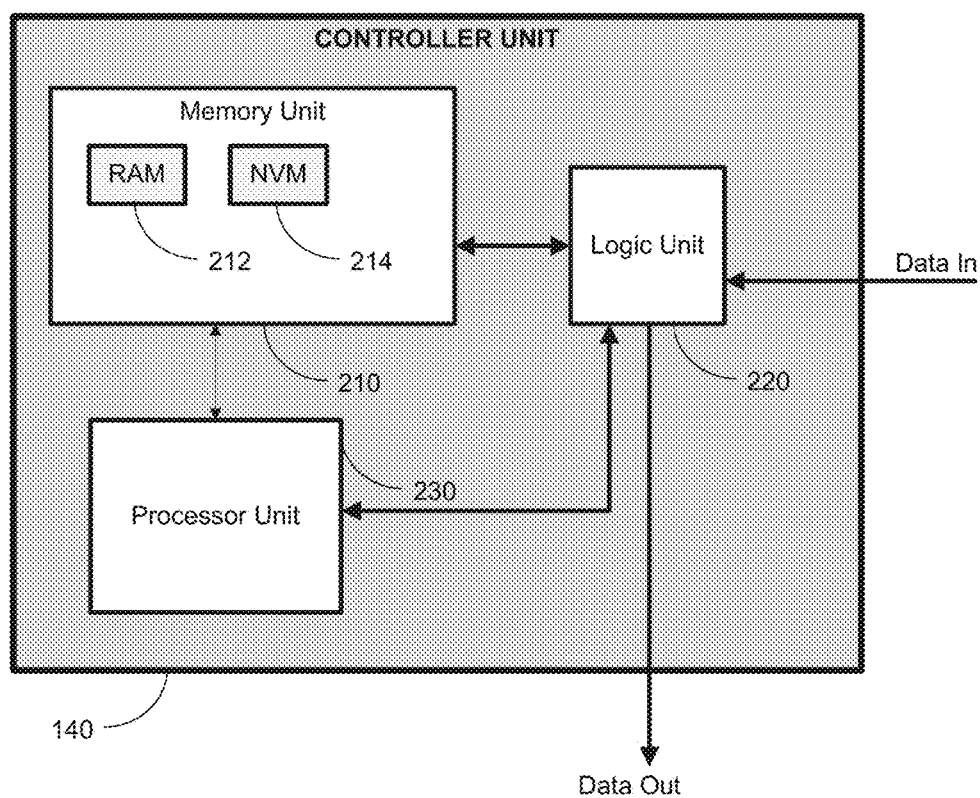
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the radar device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal data_in may represent data derived from processing and analyzing the reflected signal. The data_out signal may represent data generated for performing one or more tasks as a result of the radar signal transmission and the reflected signal. For example, the data_out signal may be used to perform an action based on the radar signal transmission and reflected signal reception.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters for controlling operations of the radar device 110. Further, the memory unit 210 may store the status data and the reaction data described above. The memory unit 210 may also store data that may be used to program any FPGA devices in the radar device 110. As such, the memory unit 210 may be subdivided into a program data memory, a status data memory, and a reaction data memory. This subdivision may be performed logically, or physically.

Figure 3:
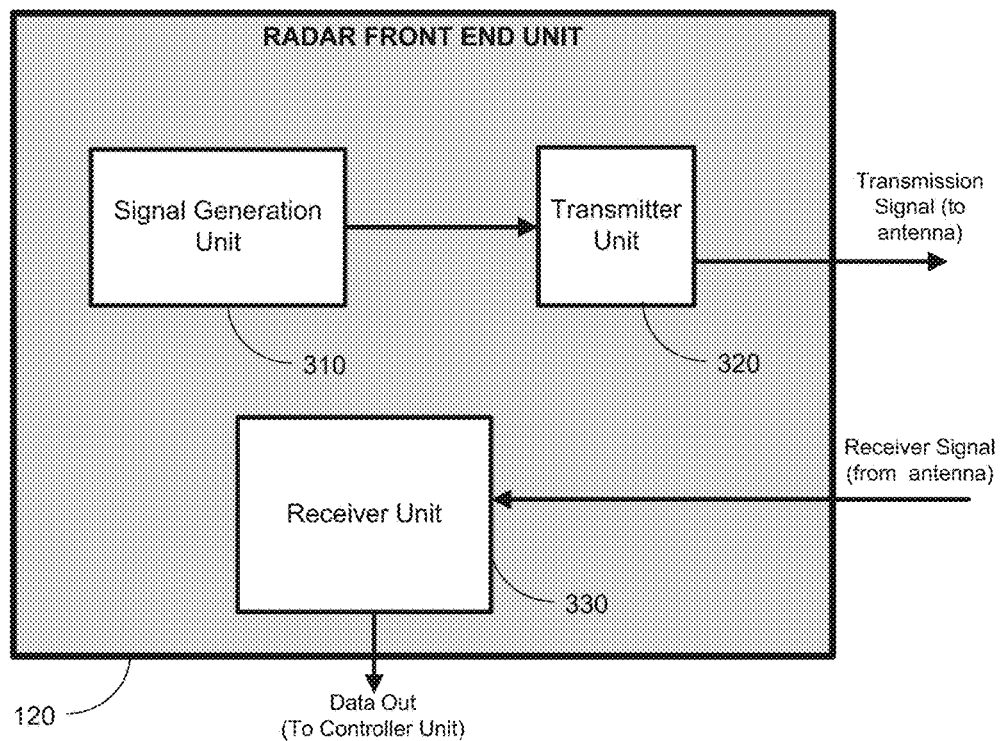
FIG. 3 illustrates a stylized block diagram depiction of the radar front end unit of FIG. 1, in accordance with embodiments herein, is illustrated.

Turning now to FIG. 3, a stylized block diagram depiction of the radar front end unit 120, in accordance with embodiments herein, is illustrated. The radar front end unit 120 may comprise a signal generation unit 310, a transmitter unit 320, and a receiver unit 330. The signal generation unit 310 is capable of generating a radar signal at a predetermined frequency. For example, a signal in the range of about 70 GHz to about 85 GHz may be generated. The signal generation unit 310 may comprise a true differential frequency doubler (FD). The FD may be formed in a push-push configuration. The signal generation unit 310 is capable of providing a radar signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a radar signal to be transmitted to the antenna unit 130.

Figure 4:
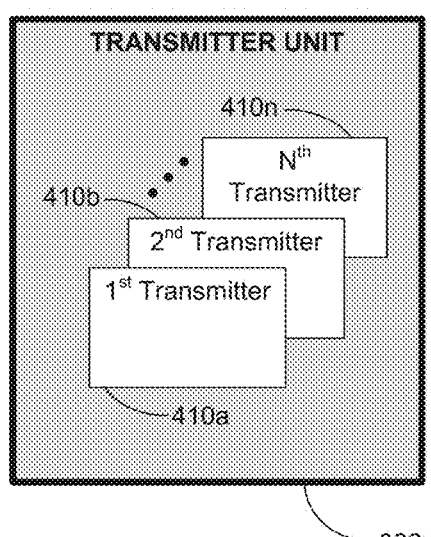
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410a, a $2^{nd}$ transmitter 410b, through an $N^{th}$ transmitter 410n (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410. For example, the signal generation unit 310 may provide a signal transmit signal for each transmitter 410, or alternatively, a $1^{th}$ transmit signal for a first set of transmitters 410 and a $2^{nd}$ transmit signal for a second set of transmitters 410.

Continuing referring to FIG. 3, a received signal (i.e., reflected signal resulting from a reflection of the radar signal from a target) is provided to the receiver unit 330. The receiver unit 330 is capable of receiving the processed received signal from the signal processing unit 150. The receiver unit 330 is capable of performing analog-to-digital (A/D) conversion, signal buffering, DSP, etc. In some embodiments, the signal processing unit 150 may perform A/D conversions and DSP; however, in other embodiments, these tasks may be performed by the receiver unit 330. The receiver unit 330 is capable of directing data_out to the controller unit 140.

Figure 5:
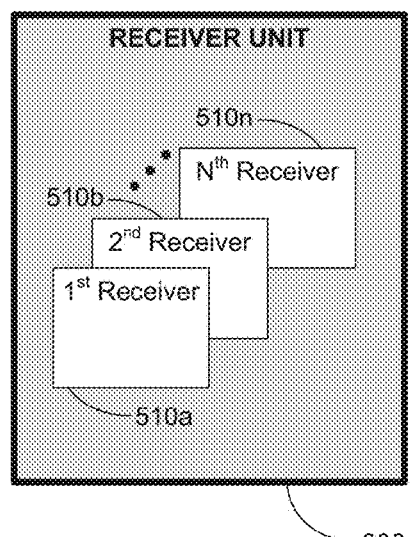
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a $1^{st}$ receiver 510a, a 2nd receiver 510b, through an Nth receiver 510n (collectively "510"). In one embodiment, the 1st through Nth receiver 510 may each process a single signal from the signal generation unit 310 and provide the signal to the controller unit 140. In another embodiment, the antenna unit 130 may provide a plurality of signals to the 1st through Nth receiver 510. For example, the antenna unit 130 may provide a signal to each receiver 510, or alternatively, a 1st receiver signal for a first set of receivers 510 and a 2nd receiver signal for a second set of receivers 510.

Figure 6:
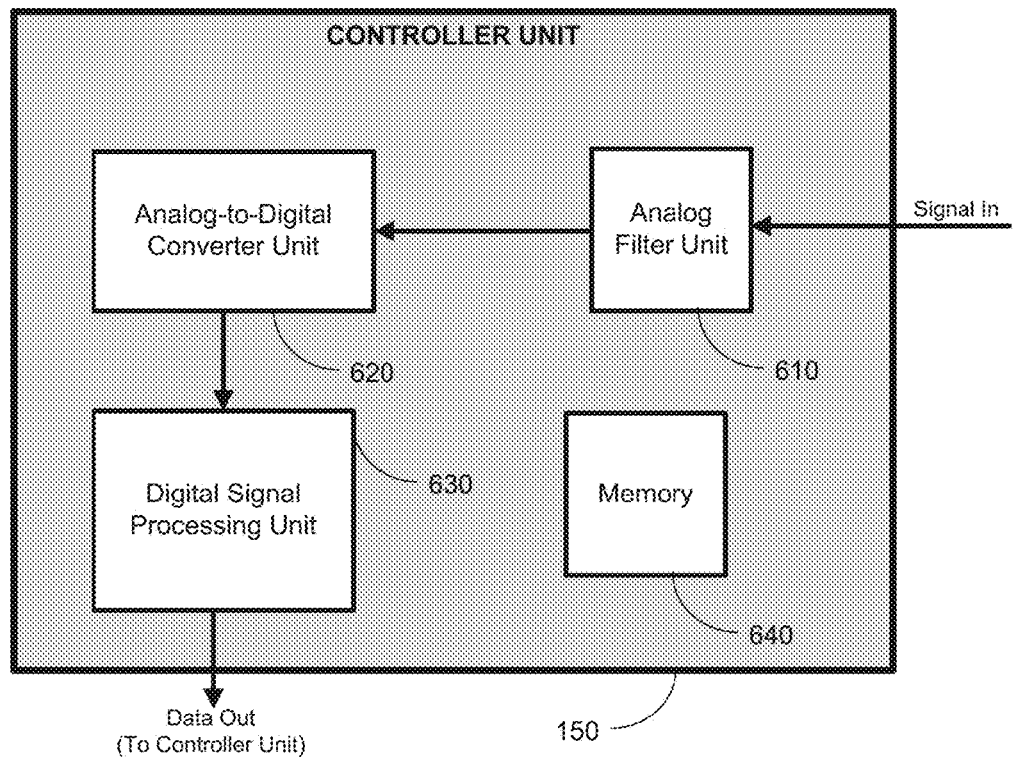
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 640 may be a first-in-first-out (FIFO) memory. In other cases, the processed digital output from the DSP unit 630 may be stored in the memory unit 210 of the controller unit 140.

Figure 7:
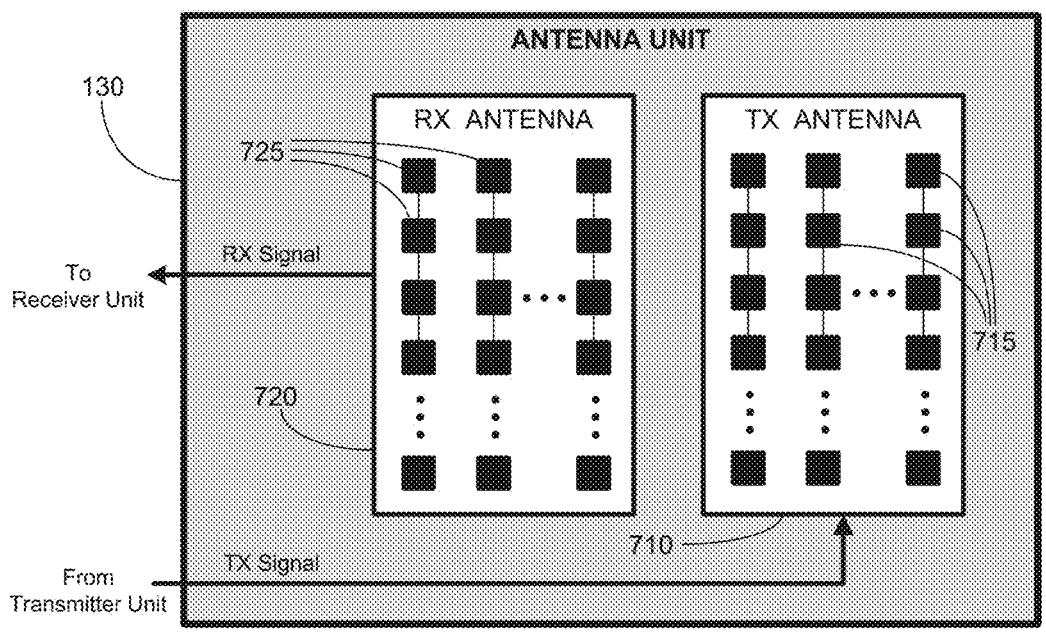
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
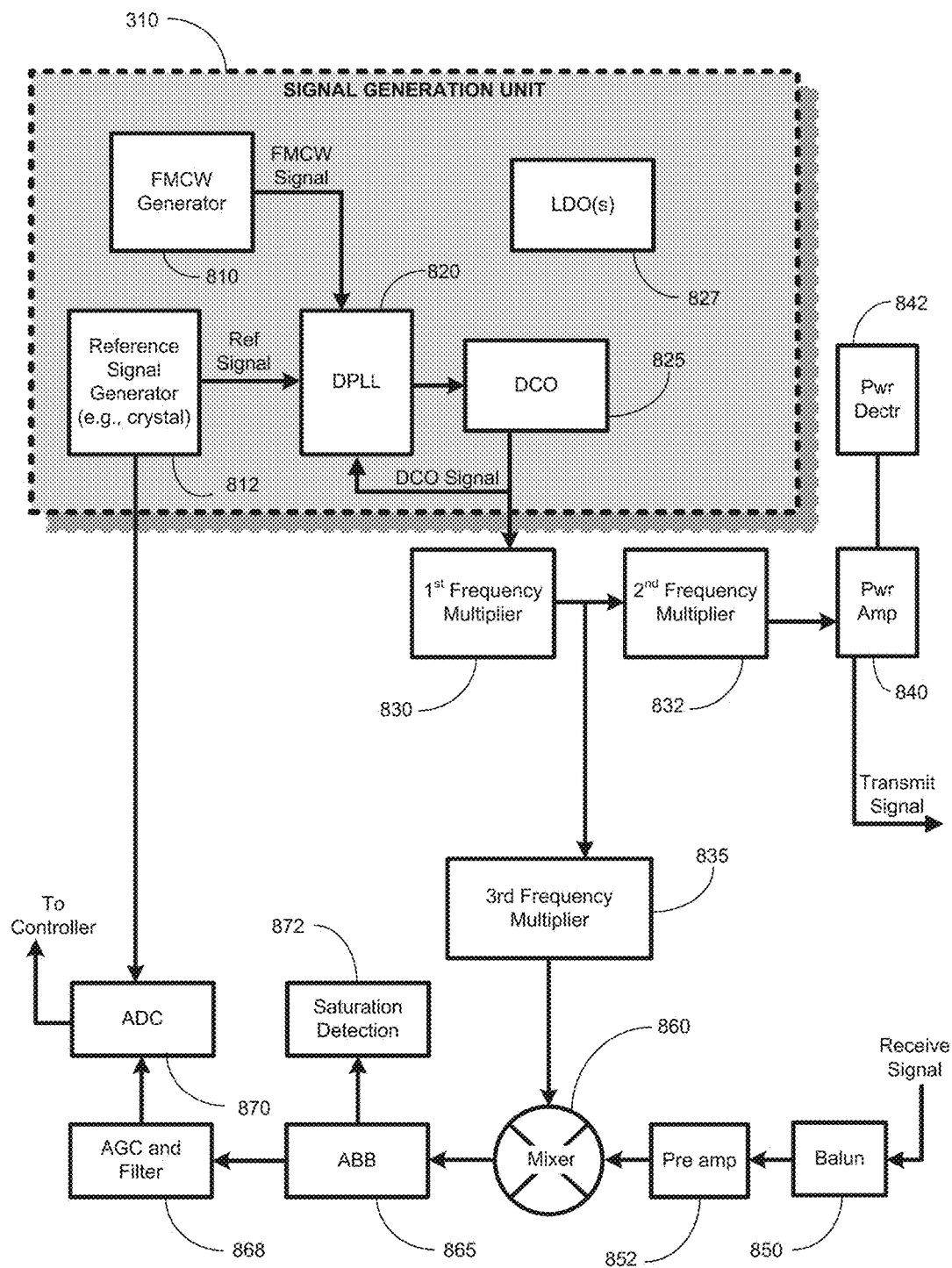
FIG. 8 illustrates a stylized block diagram depiction of an exemplary radar application of the system of FIG. 1, in accordance with embodiments herein.

Turning now to FIG. 8, a stylized block diagram depiction of one exemplary radar application of the system 100, in accordance with embodiments herein is illustrated. FIG. 8 shows one exemplary implementation of the signal generation unit 310 (FIG. 3) and one example of portions of the transmitter unit 320 and the receiver unit 330.

The signal generation unit 310 generates a signal (e.g., a radar signal) that is to be transmitted and directed to a target region, e.g., toward the area in front of a vehicle. A frequency modulated continuous wave (FMCW) generator 810 provides an mm-wave signal in the range of about 20 GHz. The FMCW generator 810 may be configured to provide a low speed ramp (LSR) signal or a high speed ramp (HSR) signal. In alternative embodiment, the FMCW generator 810 may be replaced by a pulse train generator for application of a Pulse Doppler radar system.

Further, a reference signal is provided by a reference signal generator 812. The mm-wave signal from the FMCW generator 810 and the reference signal are both sent to a digital phase lock loop (DPLL) 820. The DPLL 820 locks the phase of the mm-wave signal from the FMCW generator 810 with the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 20 GHz.

A plurality of low dropout (LDO) regulators 827, which may comprise a reference voltage, an error amplifier, a feedback voltage divider, and a plurality of pass elements, e.g., transistors. The LDO regulators 827 are configured to provide a regulated voltage supply to the various portions of the circuit of FIG. 8. Generally, this regulated voltage supply is lower than the supply voltage.

In some embodiments, it is desirable to transmit an 80 GHz signal, for example in a vehicle radar application. The DCO 825 provides a 20 GHz signal, therefore, two frequency doublers may be used to multiply the 20 GHz signal to provide a 40 GHz, and then multiply the 40 GHz signal to provide an 80 GHz signal to transmit. Accordingly, a 1st frequency multiplier 830 is used to double the 20 GHz signal to produce a 40 GHz signal. A 2nd frequency multiplier 832 is used to double the 40 GHz signal to produce an 80 GHz signal. The output of the 2nd frequency multiplier 832 is provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal.

A received signal may be processed by the circuit shown in FIG. 8. The received signal, e.g., from the signal processing unit 150, is provided to a balun circuit 850. The balun may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from a 3rd frequency multiplier 835. The output of the 3rd frequency multiplier 835 is the doubled version of the 40 GHz signal from the 1st frequency multiplier. That is, the output of the 3rd frequency multiplier 835 is an 80 GHz reference signal. The mixer 860 receives the reference 80 GHz signal and in one embodiment, multiplies it to the received signal, which is a reflected or echo signal resulting from the reflection from the transmitted signal. The output of the mixer may be used to determine various characteristics regarding an object(s) from which the transmitted signal was reflected, including direction, location, trajectory, and/or speed of the object.

Each of the 1$^{st}$ 2$^{nd}$ and 3$^{rd}$ frequency multipliers 830, 832, 835 may be a fully differential push-push frequency doubler. The frequency doubler employed by the frequency multipliers 830, 832, 835 is described in further details below.

The output of the mixer 860 is provided to an ABB 865. The output of the ABB 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions.

The person of ordinary skill in the art will be aware of modifications that may be made to the exemplary embodiments depicted in FIGS. 2-8 as a routine matter.

Figure 9:
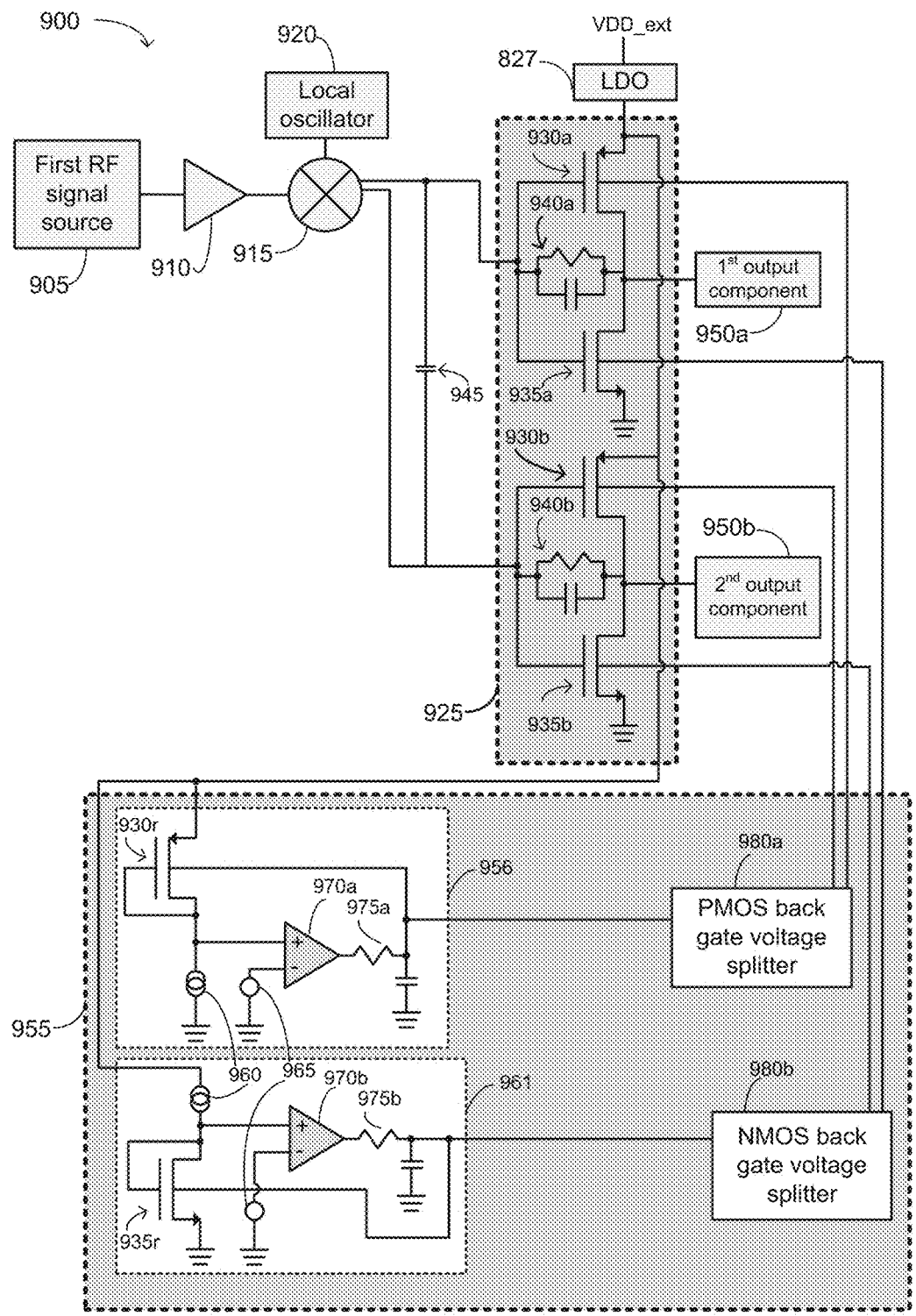
FIG. 9 illustrates a receiver circuit, in accordance with embodiments herein.

FIG. 9 depicts an implementation of a receiver circuit 900, in accordance with embodiments herein. The receiver circuit 900 comprises a transimpedance amplifier (TIA) 925. The receiver circuit 900 may be part of the receiver unit 330. The receiver circuit 900 includes a 1$^{st}$ RF signal source 905. In one embodiment, the 1$^{st}$ RF signal source may be a circuit that processes a signal received via an antenna, as exemplified in FIG. 3. The received signal from the antenna may be an current response RF signal. After processing (e.g., filtering, buffering, amplification, mixing, etc.), the TIA 925 is capable of converting this current response RF signal to a voltage response RF signal. The TIA 925 may be configured to provide a differential, voltage response RF signal, or in another embodiment, a single-ended, voltage response RF signal.

The TIA 925 has a first PMOS transistor 930*a* and a first NMOS transistor 935*a*. As is known to the person of ordinary skill in the art, PMOS transistors and NMOS transistors inherently include a gate, a source, a drain. In embodiments herein, the PMOS and NMOS transistors also include a back gate. The back gates may be used to affect the biasing of the front gate. In one embodiment, the transistors shown in FIG. 9 are formed using a fully depleted silicon-on-insulator (FDSOI) process, however, other processes that are capable of forming a transistor back gate may also be implemented in embodiments herein.

In the TIA 925 depicted in FIG. 9, the gates of the first PMOS transistor 930*a* and the first NMOS transistor 935*a* are controlled by a first component of a differential input. As depicted, the first component of the differential input may be provided by a passive mixer 915, acting on a single-ended signal provided by a first radio frequency (RF) signal source 905 and amplified by a low noise amplifier (LNA) 910. In one embodiment, the passive mixer 915 is a current mode mixer.

In one embodiment, the receiver circuit 900 comprises one LNA 910 and does not comprise two or more low noise amplifiers. Alternatively or in addition, the LNA 910 may be implemented without cascading.

Alternatively or in addition, in other embodiments (not shown), the receiver circuit 900 may comprise one or more other components configured to provide a first component of a differential input to the gates of the first PMOS transistor 930*a* and the first NMOS transistor 935*a*.

The source of the first PMOS transistor 930*a* is electrically connected to a power supply, which may be referred to herein as "VDD." In FIG. 9, the receiver circuit 900 receives power from a power supply VDD_ext and regulates the received power with low dropout (LDO) regulator 827. Alternatively or in addition, in other embodiments (not shown), the receiver circuit 900 may comprise one or more other components configured to provide a power supply to the source of the first PMOS transistor 930*a*. In one embodiment, VDD_ext has a value of about 1.8 V, and the power supply provided by LDO 827 (hereinafter, "VDD") has a value of about 1.4 V.

The source of the first NMOS transistor 935*a* is electrically connected to ground. The drains of the first PMOS transistor 930*a* and the first NMOS transistor 935*a* provide a first component 950*a* of a differential output 950.

In one embodiment, as depicted in FIG. 9, the TIA 925 may comprise a first feedback component 940*a*, such as a resistor and a capacitor in parallel. In other embodiments, the first feedback component 940*a* may comprise a resistor only, a capacitor only, or one or more alternative or additional components. Though not shown, the feedback component 940*a* (including one or more components thereof) may be adjustable. The values of the feedback component 940*a* may be predetermined based on the desired frequency response.

The TIA 925 also comprises a second PMOS transistor 930*b* and a second NMOS transistor 935*b*. The gates of the second PMOS transistor 930*b* and the second NMOS transistor 935*b* are controlled by a second component of the differential input, and the drains of the second PMOS transistor 930*b* and the second NMOS transistor 935*b* provide a second component 950*b* of the differential output 950. Generally, the second PMOS transistor 930*b* may be similar to the first PMOS transistor 930*a*, and the second NMOS transistor 935*b* may be similar to the second NMOS transistor 935*a*. Accordingly, for brevity, the second PMOS transistor 930*b* and the second NMOS transistor 935*b* need not be described further.

The TIA 925 may also comprise a second feedback component 940*b*, which may be similar to the first feedback component 940*a*, and hence need not be described further. The values of the second feedback component 940*b* may be predetermined based on the desired frequency response, and may be similar to the first feedback component 940*a*.

The PMOS transistors 930*a*, 930*b* and the NMOS transistors 935*a*, 935*b* may be conventional FETs, such as MOSFETs, provided the architecture of the transistors 930*a*, 930*b*, 935*a*, and 935*b* contains a back gate. In one embodiment, the first PMOS transistor 930*a*, the second PMOS transistor 930*b*, the first NMOS transistor 935*a*, and the second NMOS transistor 935*b* may each be a FDSOI transistor. In another embodiment, the first PMOS transistor 930*a*, the second PMOS transistor 930*b*, the first NMOS transistor 935*a*, and the second NMOS transistor 935*b* may each be a deep n-well transistor.

The receiver circuit 900 also comprises a back gate voltage control unit 955. The back gate voltage control unit 955 is configured to provide at least one PMOS back gate voltage to the back gate of at least one of the first PMOS transistor 930*a* and the second PMOS transistor 930*b*, and to provide at least one NMOS back gate voltage to the back gate of at least one of the first NMOS transistor 935*a* and the second NMOS transistor 935*b*. In one embodiment, as depicted in FIG. 9, the back gate voltage control unit 955 is configured to provide a first PMOS back gate voltage to the back gate of the first PMOS transistor 930*a*, a second PMOS back gate voltage to the back gate of the second PMOS transistor 930*b*, a first NMOS back gate voltage to the back gate of the first NMOS transistor 935*a*, and a second NMOS back gate voltage to the back gate of the second NMOS transistor 935*b*. The first and second PMOS back gate voltages may be the same or may be different, and/or the first and second NMOS back gate voltages may be the same or may be different. The back gate voltage from the back gate controller 955 may be used to affect the biasing of the front gates of the transistors of the TIA 925.

By controlling the back gate voltages of the PMOS transistors 930a, 930b and the NMOS transistors 935a, 935b, the thresholds of the PMOS transistors 930a, 930b and the NMOS transistors 935a, 935b may be kept constant despite variations in the manufacturing process(es) used to form the transistors and the TIA 925; the voltages applied to the TIA 925 by the LDO 827 and/or the first RF signal originating from the first RF signal source 905; and the temperature at which the TIA 925 operates.

Controlling the back gate voltages of the PMOS transistors 930a, 930b and the NMOS transistors 935a, 935b may also render the compression point of the receiver circuit 900 relatively high. For example, in one embodiment, a receiver circuit 900 may experience a compression superior to the compression of the prior art device referred to in the Background.

In a particular embodiment, as depicted in FIG. 9, the back gate voltage control unit 955 may comprise a bias current source 960. The bias current source 960 may provide a fixed or an adjustable current. In one embodiment, the current provided by the bias current source 960 is adjusted based on the ambient temperature of a device comprising the receiver circuit 900. The current provided by the bias current source 960 may be generated from a bandgap.

The back gate voltage control unit 955 may also comprise a first PMOS replica circuit 956. The first PMOS replica circuit 956 comprises a first PMOS replica transistor 930r. The first PMOS replica transistor 930r is substantially similar to the first and second PMOS transistors 930a, 930b. The source of the first PMOS replica transistor 930r is electrically connected to the power supply (e.g., LDO 827) and the gate and the drain of the PMOS replica transistor 930r are electrically connected to a first input of a first amplifier 970a.

The first amplifier 970a comprises two inputs. In addition to being electrically connected to the gate and the drain of the PMOS replica transistor 930r, the first input of the first amplifier 970a is electrically connected the bias current source 960. The second input of the first amplifier 970a is configured to receive a fixed voltage equal to the threshold voltage of the PMOS transistor, which is provided by fixed voltage source 965.

The first amplifier 970a provides one output, a PMOS back gate voltage, which is provided to the back gate of the first PMOS replica transistor 930r and the back gate(s) of one or more of the first and second PMOS transistors 930a and 930b. In one embodiment, the PMOS back gate voltage may be adjusted through the range of 0 V to the voltage VDD. The fixed voltage provided by fixed voltage source 965 may be equal to the threshold voltage of the first PMOS transistor 930a under the condition of the PMOS back gate voltage having a value of VDD/2 V. The term "fixed" is used to indicate that the voltage provided by source 965 may be adjusted less frequently than the voltage output of the first PMOS replica circuit 956. In other words, the fixed voltage provided by fixed voltage source 965 may be adjusted from time to time.

In the depicted embodiment of FIG. 9, the PMOS back gate voltage may be provided to the back gate(s) of both the first and second PMOS transistors 930a and 930b by a PMOS back gate voltage splitter 980a. The PMOS back gate voltage splitter 980a may be configured to provide the same back gate voltage to the back gates of the first and second PMOS transistors 930a and 930b, or it may be configured to provide different back gate voltages to the back gates of the first and second PMOS transistors 930a and 930b. The PMOS back gate voltage splitter 980a may also provide DC correction to the TIA 925.

The back gate voltage control unit 955 may further comprise a first NMOS replica circuit 961. The first NMOS replica circuit 961 comprises a first NMOS replica transistor 935r. The first NMOS replica transistor 935r is substantially similar to the first and second NMOS transistors 935a, 935b. The source of the first NMOS replica transistor 935r is electrically connected to ground and the gate and the drain of the NMOS replica transistor 935r are electrically connected to a first input of a second amplifier 970b.

The second amplifier 970b comprises two inputs. In addition to being electrically connected to the gate and the drain of the NMOS replica transistor 935r, the first input of the second amplifier 970b is electrically connected to the bias current source 960. The second input of the second amplifier 970b is configured to receive a fixed voltage equal to the threshold voltage of the NMOS transistor, which is provided by fixed voltage source 965. In embodiments, the fixed voltage source 965 may provide different voltages to the second inputs of the first amplifier 970a and the second amplifier 970b.

The second amplifier 970b provides one output, an NMOS back gate voltage, which is provided to the back gate of the first NMOS replica transistor 935r and the back gate(s) of one or more of the first and second NMOS transistors 935a and 935b. In one embodiment, the NMOS back gate voltage may be adjusted through the range of 0 V to the voltage VDD. The fixed voltage provided by fixed voltage source 965 may be equal to the threshold voltage of the first NMOS transistor 935a under the condition of the NMOS back gate voltage having a value of VDD/2 V.

In the depicted embodiment of FIG. 9, the NMOS back gate voltage may be provided to the back gate(s) of both the first and second NMOS transistors 935a and 935b by an NMOS back gate voltage splitter 980b. The NMOS back gate voltage splitter 980b may be configured to provide the same back gate voltage to the back gates of the first and second NMOS transistors 935a and 935b, or it may be configured to provide different back gate voltages to the back gates of the first and second NMOS transistors 935a and 935b. The NMOS back gate voltage splitter 980b may also provide DC correction to the TIA 925.

In one embodiment, the first PMOS replica circuit 956 may further comprise a first radio frequency (RF) filter 975a configured to receive the output of the first amplifier 970a and provide the first PMOS back gate voltage to back gates of the first PMOS replica transistor 930r and one or both of the PMOS transistors 930a, 930b. Alternatively or in addition, the first NMOS replica circuit 961 may further comprise a second radio frequency (RF) filter 975b configured to receive an output of the second amplifier 970b and provide the first NMOS back gate voltage to back gates of the first NMOS replica transistor 935r and one or both of the first NMOS transistors 935a, 935b.

Although only one bias current source 960 and one fixed voltage source 965 are shown in FIG. 9, in other embodiments, each replica circuit 956, 961 may comprise its own bias current source 960 and/or its own fixed voltage source 965.

In one embodiment, as depicted in FIG. 9, the receiver circuit 900 may comprise a feedback component 945, such as a capacitor between the lines carrying the first and second components of the differential input. In other embodiments, the feedback component 945 may comprise a resistor and/or one or more alternative or additional components. Though not shown, the feedback component 945 may be adjustable.

Figure 10:
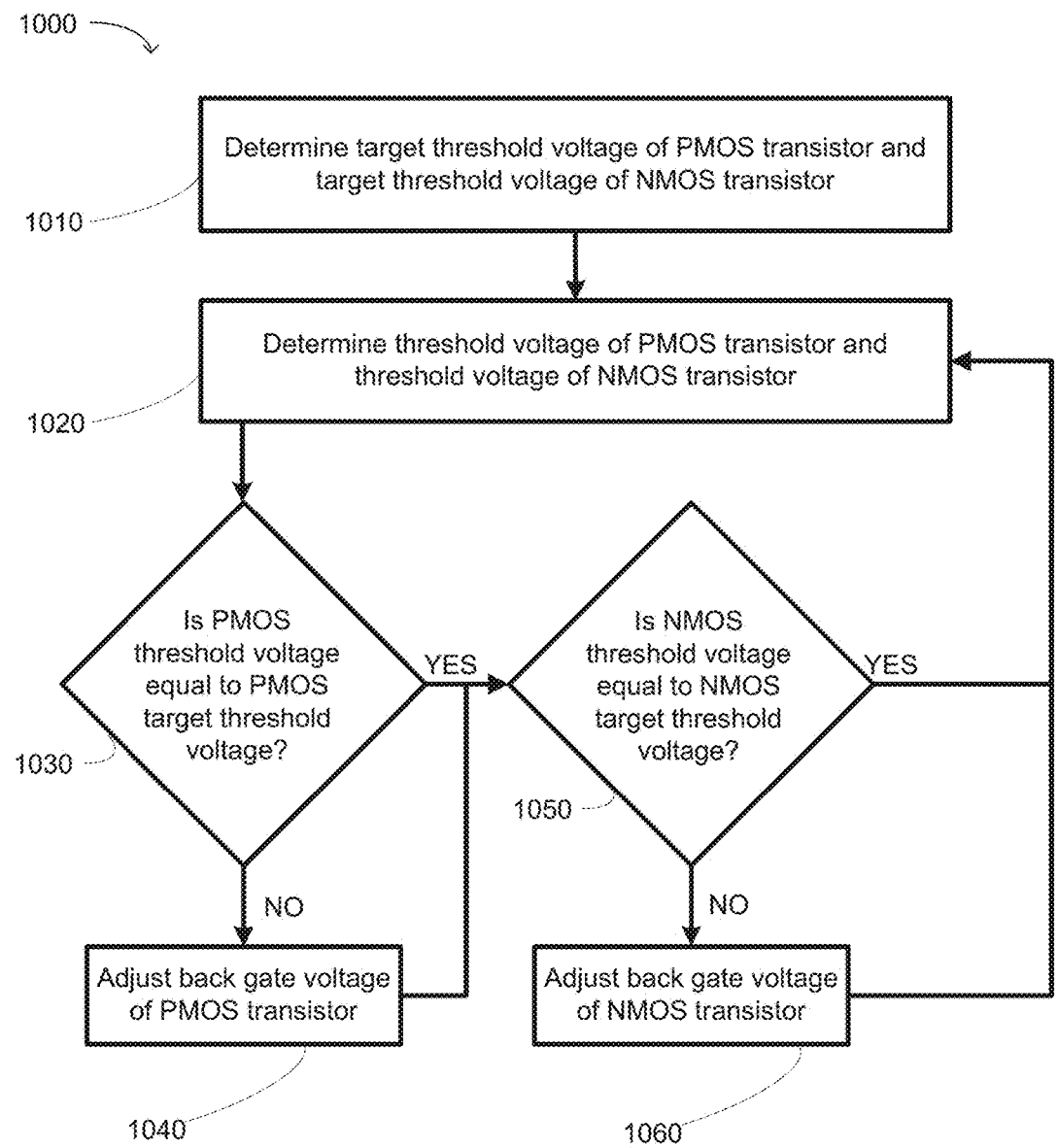
FIG. 10 illustrates a method, in accordance with embodiments herein.

FIG. 10 provides a flowchart of a method 1000, in accordance with embodiments herein. As depicted, the method 1000 comprises determining (at 1010) a target threshold voltage of a PMOS transistor and a target threshold voltage of a NMOS transistor. The PMOS transistor and the NMOS transistor are configured such that the gates of the PMOS transistor and the NMOS transistor are controlled by a component of a differential input, the source of the PMOS transistor is electrically connected to a power supply, the source of the NMOS transistor is electrically connected to ground, and the drains of the PMOS transistor and the NMOS transistor provide a component of a differential output. For example, the PMOS transistor may be the first PMOS transistor 930a and the NMOS transistor may be the first NMOS transistor 935a.

In a further embodiment, the first PMOS transistor and the first NMOS transistor may be in parallel with a first feedback component, such as first feedback component 940a.

Alternatively or in addition, the first PMOS transistor and the first NMOS transistor may be formed on fully depleted silicon on insulator (FDSOI).

The target threshold voltages may be determined as a routine matter, based on the intended use of a device comprising the PMOS transistor and the NMOS transistor, the architectures of the PMOS transistor and the NMOS transistor, the frequency range or power range of the differential input, and/or other parameters that will be apparent to the person of ordinary skill in the art.

The method 1000 also comprises determining (at 1020) a threshold voltage of the PMOS transistor and a threshold voltage of the NMOS transistor. The threshold voltage of a transistor may vary based on processing variations when forming the transistor. For example, the threshold voltage may be increased in a particular transistor proportionally to an increase in the thickness (relative to a nominal specification) of the gate oxide formed during production of the transistor. The threshold voltage of a transistor may also vary based on the ambient temperature at which the transistor is used. For example, the threshold voltage will tend to decrease with increasing temperature. The effect of temperature may be especially relevant when a device comprising the receiver circuit is used in an outdoor application. One such application is automotive radars, which must be rated to function at temperatures from −40° C. to +140° C.

Generally, the greater the threshold voltages of the PMOS transistor and the NMOS transistor, the greater the compression of a receiver circuit comprising the transistors.

Upon determining the target threshold voltage (at 1010) and the threshold voltage (at 1020), the threshold voltage of the PMOS transistor may be compared (at 1030) to the target threshold voltage of the PMOS transistor. If the threshold voltage of the PMOS transistor is not equal to the target threshold voltage of the PMOS transistor, flow moves to adjusting (at 1040) a back gate voltage of the PMOS transistor, in order to bring the threshold voltage of the PMOS transistor equal to the target threshold voltage of the PMOS transistor. Generally, an increase in the back gate voltage will increase the threshold voltage, and a decrease in the back gate voltage will decrease the threshold voltage. The person of ordinary skill in the art having the benefit of the present disclosure will be able to perform or encode in a computerized implementation the adjusting (at 1040) as a routine matter.

In one embodiment, adjusting (at 1040) the back gate voltage of the PMOS transistor may comprise providing an output of a first PMOS replica circuit, comprising a first PMOS replica transistor and a first amplifier, wherein the source of the PMOS transistor is electrically connected to the power supply, the gate and the drain of the PMOS transistor are electrically connected to a first input of the first amplifier, a bias current source is electrically connected to the first input of the first amplifier, a second input of the first amplifier is configured to receive a fixed voltage equal to the threshold voltage of the PMOS transistor, and the first amplifier is configured to provide the first PMOS back gate voltage to the first PMOS replica transistor and the first PMOS transistor. For example, the back gate voltage may be provided by first PMOS replica circuit 956 of a back gate voltage control unit 955.

In a further embodiment, the first PMOS replica circuit may further comprise a first radio frequency (RF) filter configured to receive an output of the first amplifier and provide the first PMOS back gate voltage to the first PMOS replica transistor and the first PMOS transistor.

On the other hand, if the comparing (at 1030) indicates that the threshold voltage of the PMOS transistor is equal to the target threshold voltage of the PMOS transistor, flow moves to comparing (at 1050) the threshold voltage of the NMOS transistor to the target threshold voltage of the NMOS transistor. If the threshold voltage of the NMOS transistor is not equal to the target threshold voltage of the NMOS transistor, flow moves to adjusting (at 1060) the back gate voltage of the NMOS transistor, in order to bring the threshold voltage of the NMOS transistor equal to the target threshold voltage of the NMOS transistor. The person of ordinary skill in the art having the benefit of the present disclosure will be able to perform or encode in a computerized implementation the adjusting (at 1060) as a routine matter.

In one embodiment, adjusting (at 1060) the back gate voltage of the NMOS transistor may comprise providing an output of a first NMOS replica circuit, comprising a first NMOS replica transistor and a second amplifier, wherein the source of the NMOS transistor is electrically connected to the ground, the gate and the drain of the NMOS transistor are electrically connected to a first input of the second amplifier, the bias current source is electrically connected to the first input of the second amplifier, a second input of the second amplifier is configured to receive a fixed voltage equal to the threshold voltage of the NMOS transistor, and the first amplifier is configured to provide the first NMOS back gate voltage to the first NMOS replica transistor and the first NMOS transistor. For example, the back gate voltage may be provided by first NMOS replica circuit 961 of a back gate voltage control unit 955.

In a further embodiment, the first NMOS replica circuit may further comprise a second radio frequency (RF) filter configured to receive an output of the second amplifier and provide the first NMOS back gate voltage to the first NMOS replica transistor and the first NMOS transistor.

On the other hand, if the threshold voltage of the NMOS transistor is equal to the target threshold voltage of the NMOS transistor, flow moves from comparing (at 1050) back to determining (at 1020). The method 1000 may then loop through elements 1020-1060 at any desired frequency and for any desired duration. If the method 1000 is performed by an automotive radar device, the method 1000 may be performed continually when the automobile's engine is on.

Figure 11:
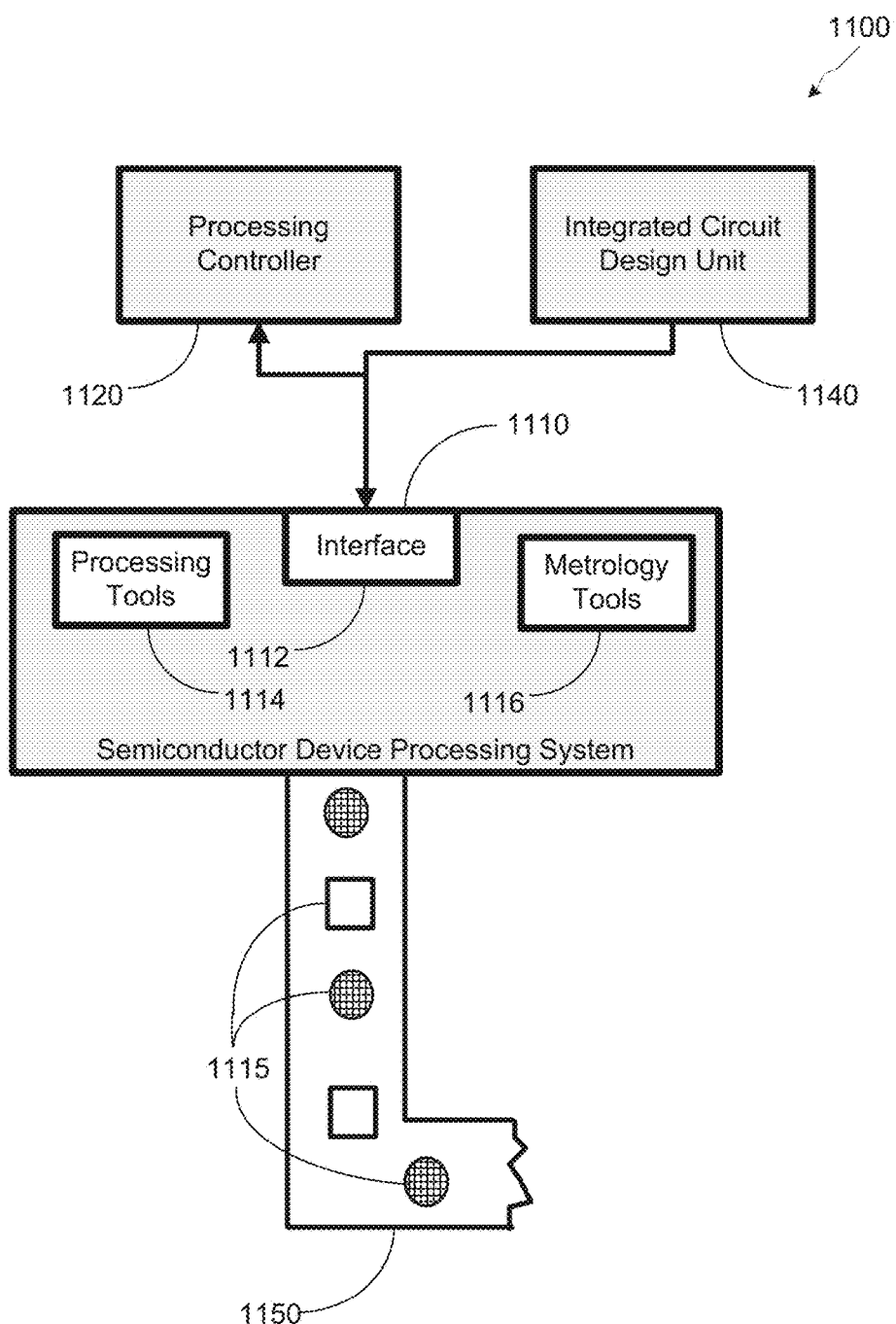
FIG. 11 illustrates a stylized depiction of a system for fabricating a semiconductor device, in accordance with embodiments herein.

Turning now to FIG. 11, a stylized depiction of a system 1100 for fabricating a semiconductor device package comprising a power amplifier circuit, in accordance with embodiments herein, is illustrated. A system 1100 of FIG. 11 may comprise a semiconductor device processing system 1110 and an integrated circuit design unit 1140. The semiconductor device processing system 1110 may manufacture integrated circuit devices based upon one or more designs provided by the integrated circuit design unit 1140.

The semiconductor device processing system 1110 may comprise various processing stations, such as etch process stations, photolithography process stations, CMP process stations, etc. Each of the processing stations may comprise one or more processing tools 1114 and or metrology tools 1116. Feedback based on data from the metrology tools 1116 may be used to modify one or more process parameters used by the processing tools 1114 for performing process steps.

The semiconductor device processing system 1110 may also comprise an interface 1112 that is capable of providing communications between the processing tools 1114, the metrology tools 1116, and a controller, such as the processing controller 1120. One or more of the processing steps performed by the semiconductor device processing system 1110 may be controlled by the processing controller 1120. The processing controller 1120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1110 may produce integrated circuits on a medium, such as silicon wafers. More particularly, the semiconductor device processing system 1110 may produce integrated circuits comprising a receiver circuit, such as the receiver circuit 900 depicted in FIG. 9.

The production of integrated circuits by the semiconductor device processing system 1110 may be based upon the circuit designs provided by the integrated circuit design unit 1140. The semiconductor device processing system 1110 may provide processed integrated circuits/devices 1115 on a transport mechanism 1150, such as a conveyor system. In some embodiments, the conveyor system may be sophisticated clean room transport systems that are capable of transporting semiconductor wafers. In one embodiment, the semiconductor device processing system 1110 may implement a plurality of processing steps, e.g., steps required to form the receiver circuit 900 described above and depicted in FIG. 9.

In some embodiments, the items labeled "1115" may represent individual wafers, and in other embodiments, the items 1115 may represent a group of semiconductor wafers, e.g., a "lot" of semiconductor wafers. The integrated circuit or device 1115 may comprise a transistor, a capacitor, a resistor, a memory cell, a processor, and/or the like.

The integrated circuit design unit 1140 of the system 1100 is capable of providing a circuit design that may be manufactured by the semiconductor device processing system 1110. This may include information regarding whether each PMOS transistor 930a, 930b receives the same or a different back gate voltage; whether each NMOS transistor 935a, 935b receives the same or a different back gate voltage; etc.

The integrated circuit design unit 1140 may be capable of determining the number of devices (e.g., processors, memory devices, etc.) to place in a device package. Based upon such details of the devices, the integrated circuit design unit 1140 may determine specifications of the devices that are to be manufactured. Based upon these specifications, the integrated circuit design unit 1140 may provide data for manufacturing a semiconductor device package described herein.

The system 1100 may be capable of performing analysis and manufacturing of various products involving various technologies. For example, the system 1100 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1100 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A receiver circuit, comprising:
   a transimpedance amplifier (TIA) comprising:
      a first PMOS transistor and a first NMOS transistor, wherein the gates of the first PMOS transistor and the first NMOS transistor are controlled by a first component of a differential input, the source of the first PMOS transistor is electrically connected to a power supply, the source of the first NMOS transistor is electrically connected to ground, and the drains of the first PMOS transistor and the first NMOS transistor provide a first component of a differential output; and
      a second PMOS transistor and a second NMOS transistor, wherein the gates of the second PMOS transistor and the second NMOS transistor are controlled by a second component of a differential input, the source of the second PMOS transistor is electrically connected to a power supply, the source of the second NMOS transistor is electrically connected to ground, and the drains of the second PMOS transistor and the second NMOS transistor provide a second component of a differential output;
   and
   a back gate voltage control unit configured to provide a first PMOS back gate voltage to the back gate of the first PMOS transistor, a second PMOS back gate voltage to the back gate of the second PMOS transistor, a first NMOS back gate voltage to the back gate of the first NMOS transistor, and a second NMOS back gate voltage to the back gate of the second NMOS transistor, wherein all of the first PMOS back gate voltage, the second PMOS back gate voltage, the first NMOS back gate voltage, and the second NMOS back gate voltage may be different.

2. The receiver circuit of claim 1, wherein the back gate voltage control unit comprises:
   a bias current source;
   a first PMOS replica circuit, comprising:
      a first PMOS replica transistor, and
      a first amplifier,
         wherein the source of the PMOS transistor is electrically connected to the power supply, the gate and the drain of the PMOS transistor are electrically connected to a first input of the first amplifier, the bias current source is electrically connected to the first input of the first amplifier, a second input of the first amplifier is configured to receive a fixed voltage equal to the threshold voltage of the PMOS transistor, and the first amplifier is configured to provide the first PMOS back gate voltage to the first PMOS replica transistor and the first PMOS transistor; and a first NMOS replica circuit, comprising:
a first NMOS replica transistor, and
a second amplifier,
wherein the source of the NMOS transistor is electrically connected to the ground, the gate and the drain of the NMOS transistor are electrically connected to a first input of the second amplifier, the bias current source is electrically connected to the first input of the second amplifier, a second input of the second amplifier is configured to receive a fixed voltage equal to the threshold voltage of the NMOS transistor, and the first amplifier is configured to provide the first NMOS back gate voltage to the first NMOS replica transistor and the first NMOS transistor.

3. The receiver circuit of claim 2, wherein the first PMOS replica circuit further comprises a first radio frequency (RF) filter configured to receive an output of the first amplifier and provide the first PMOS back gate voltage to the first PMOS replica transistor and the first PMOS transistor; and the first NMOS replica circuit further comprises a second radio frequency (RF) filter configured to receive an output of the second amplifier and provide the first NMOS back gate voltage to the first NMOS replica transistor and the first NMOS transistor.

4. The receiver circuit of claim 1, wherein the TIA further comprises at least one of a first feedback component in parallel with the first PMOS transistor and the first NMOS transistor, and a second feedback component in parallel with the second PMOS transistor and the second NMOS transistor.

5. The receiver circuit of claim 1, wherein the first PMOS transistor, the first NMOS transistor, the second PMOS transistor, and the second NMOS transistor are formed on fully depleted silicon on insulator (FDSOI).

6. The receiver circuit of claim 1, further comprising:
a low noise amplifier and a passive mixer, wherein the passive mixer is configured to provide the first and second components of the differential input to the TIA.

7. A method, comprising:
determining a target threshold voltage of a PMOS transistor and a target threshold voltage of a NMOS transistor, wherein the gates of the PMOS transistor and the NMOS transistor are controlled by a component of a differential input, the source of the PMOS transistor is electrically connected to a power supply, the source of the NMOS transistor is electrically connected to ground, and the drains of the PMOS transistor and the NMOS transistor provide a component of a differential output;
determining a threshold voltage of the PMOS transistor and a threshold voltage of the NMOS transistor;
adjusting a back gate voltage of the PMOS transistor, in response to determining that the threshold voltage of the PMOS transistor is not equal to the target threshold voltage of the PMOS transistor, in order to bring the threshold voltage of the PMOS transistor equal to the target threshold voltage of the PMOS transistor; and
adjusting a back gate voltage of the NMOS transistor, in response to determining that the threshold voltage of the NMOS transistor is not equal to the target threshold voltage of the NMOS transistor, in order to bring the threshold voltage of the NMOS transistor equal to the target threshold voltage of the NMOS transistor.

8. The method of claim 7, wherein:
adjusting the back gate voltage of the PMOS transistor comprises providing an output of a first PMOS replica circuit, comprising a first PMOS replica transistor and a first amplifier, wherein the source of the first PMOS replica transistor is electrically connected to the power supply, the gate and the drain of the first PMOS replica transistor are electrically connected to a first input of the first amplifier, a bias current source is electrically connected to the first input of the first amplifier, a second input of the first amplifier is configured to receive a fixed voltage equal to the threshold voltage of the first PMOS transistor, and the first amplifier is configured to provide the first PMOS back gate voltage to the first PMOS replica transistor and the first PMOS transistor; and
adjusting the back gate voltage of the NMOS transistor comprises providing an output of a first NMOS replica circuit, comprising a first NMOS replica transistor and a second amplifier, wherein the source of the first NMOS replica transistor is electrically connected to the ground, the gate and the drain of the first NMOS replica transistor are electrically connected to a first input of the second amplifier, the bias current source is electrically connected to the first input of the second amplifier, a second input of the second amplifier is configured to receive a fixed voltage equal to the threshold voltage of the NMOS transistor, and the first amplifier is configured to provide the first NMOS back gate voltage to the first NMOS replica transistor and the first NMOS transistor.

9. The method of claim 8, wherein the first PMOS replica circuit further comprises a first radio frequency (RF) filter configured to receive an output of the first amplifier and provide the first PMOS back gate voltage to the first PMOS replica transistor and the first PMOS transistor; and the first NMOS replica circuit further comprises a second radio frequency (RF) filter configured to receive an output of the second amplifier and provide the first NMOS back gate voltage to the first NMOS replica transistor and the first NMOS transistor.

10. The method of claim 7, wherein the first PMOS transistor and the first NMOS transistor are in parallel with a first feedback component.

11. The method of claim 7, wherein the first PMOS transistor and the first NMOS transistor are formed on fully depleted silicon on insulator (FDSOI).

12. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
form a receiver circuit, comprising:
forming a transimpedance amplifier (TIA) comprising a first PMOS transistor and a first NMOS transistor, wherein the gates of the first PMOS transistor and the first NMOS transistor are controlled by a first component of a differential input, the source of the first PMOS transistor is electrically connected to a power supply, the source of the first NMOS transistor is electrically connected to ground, and the drains of the first PMOS transistor and the first NMOS transistor provide a first component of a differential output; and a second PMOS transistor and a second NMOS transistor, wherein the gates of the second PMOS transistor and the second NMOS transistor are controlled by a second component of a differential input, the source of the second PMOS transistor is electrically connected to a power supply, the source of the second NMOS transistor is electrically connected to ground, and the drains of the second PMOS transistor and the second NMOS transistor provide a second component of a differential output; and forming a back gate voltage control unit configured to provide a first PMOS back gate voltage to the back gate of the first PMOS transistor, a second PMOS back gate voltage to the back gate of the second PMOS transistor, a first NMOS back gate voltage to the back gate of the first NMOS transistor, and a second NMOS back gate voltage to the back gate of the second NMOS transistor, wherein all of the first PMOS back gate voltage, the second PMOS back gate voltage, the first NMOS back gate voltage, and the second NMOS back gate voltage may be different.

13. The system of claim 12, wherein the semiconductor device processing system is adapted to form the back gate voltage control unit such that the back gate voltage control unit comprises:

a bias current source;

a first PMOS replica circuit, comprising a first PMOS replica transistor, and a first amplifier, wherein the source of the PMOS transistor is electrically connected to the power supply, the gate and the drain of the PMOS transistor are electrically connected to a first input of the first amplifier, the bias current source is electrically connected to the first input of the first amplifier, a second input of the first amplifier is configured to receive a fixed voltage equal to the threshold voltage of the PMOS transistor, and the first amplifier is configured to provide the first PMOS back gate voltage to the first PMOS replica transistor and the first PMOS transistor; and a first NMOS replica circuit, comprising a first NMOS replica transistor, and a second amplifier, wherein the source of the NMOS transistor is electrically connected to the ground, the gate and the drain of the NMOS transistor are electrically connected to a first input of the second amplifier, the bias current source is electrically connected to the first input of the second amplifier, a second input of the second amplifier is configured to receive a fixed voltage equal to the threshold voltage of the NMOS transistor, and the first amplifier is configured to provide the first NMOS back gate voltage to the first NMOS replica transistor and the first NMOS transistor.

14. The system of claim 13, wherein the semiconductor device processing system is adapted to form the first PMOS replica circuit such that the first PMOS replica circuit further comprises a first radio frequency (RF) filter configured to receive an output of the first amplifier and provide the first PMOS back gate voltage to the first PMOS replica transistor and the first PMOS transistor; and to form the first NMOS replica circuit such that the first NMOS replica circuit further comprises a second radio frequency (RF) filter configured to receive an output of the second amplifier and provide the first NMOS back gate voltage to the first NMOS replica transistor and the first NMOS transistor.

15. The system of claim 12, wherein the semiconductor device processing system is further adapted to form at least one of a first feedback component in parallel with the first PMOS transistor and the first NMOS transistor, and a second feedback component in parallel with the second PMOS transistor and the second NMOS transistor.

16. The system of claim 12, wherein the semiconductor device processing system is adapted to form the first PMOS transistor, the first NMOS transistor, the second PMOS transistor, and the second NMOS transistor on fully depleted silicon on insulator (FDSOI).

17. The system of claim 12, wherein the semiconductor device processing system is further adapted to form a low noise amplifier and a passive mixer, wherein the passive mixer is configured to provide the first and second components of the differential input to the TIA.

* * * * *